(12) United States Patent
Liu et al.

(10) Patent No.: US 8,501,626 B2
(45) Date of Patent: Aug. 6, 2013

(54) METHODS FOR HIGH TEMPERATURE ETCHING A HIGH-K MATERIAL GATE STRUCTURE

(75) Inventors: Wei Liu, San Jose, CA (US); Eiichi Matsusue, Yokohama (JP); Meihua Shen, Fremont, CA (US); Shashank Deshmukh, San Jose, CA (US); Anh-Kiet Quang Phan, San Jose, CA (US); David Palagashvili, Mountain View, CA (US); Michael D. Willwerth, Campbell, CA (US); Jong I. Shin, Santa Clara, CA (US); Barrett Finch, San Jose, CA (US); Yohei Kawase, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 1114 days.

(21) Appl. No.: 12/146,303

(22) Filed: Jun. 25, 2008

(65) Prior Publication Data

US 2009/0004870 A1    Jan. 1, 2009

Related U.S. Application Data

(60) Provisional application No. 60/946,581, filed on Jun. 27, 2007, provisional application No. 60/987,159, filed on Nov. 12, 2007.

(51) Int. Cl.
*H01L 21/302* (2006.01)
*H01L 21/461* (2006.01)
*C03C 15/00* (2006.01)
*C03C 25/68* (2006.01)

(52) U.S. Cl.
USPC ........... 438/696; 216/41; 216/46; 216/51; 216/72; 438/700; 438/710; 438/958

(58) Field of Classification Search
None
See application file for complete search history.

(56) References Cited

U.S. PATENT DOCUMENTS

| 5,071,714 A | 12/1991 | Rodbell et al. |
| 5,110,408 A | 5/1992 | Fujii et al. |

(Continued)

FOREIGN PATENT DOCUMENTS

| CN | 1802732 | 7/2006 |
| CN | 1921072 | 2/2007 |

(Continued)

OTHER PUBLICATIONS

Helot et al. "Plasma etching of HfO2 at elevated temperatures in chlorine-based chemistry" Dec. 9, 2005 J. Vac. Sci. Technol. A 24(1) p. 30-40.*

(Continued)

*Primary Examiner* — Allan Olsen
*Assistant Examiner* — Margaret D Klunk
(74) *Attorney, Agent, or Firm* — Patterson & Sheridan, LLP

(57) ABSTRACT

Methods for etching high-k material at high temperatures are provided. In one embodiment, a method etching high-k material on a substrate may include providing a substrate having a high-k material layer disposed thereon into an etch chamber, forming a plasma from an etching gas mixture including at least a halogen containing gas into the etch chamber, maintaining a temperature of an interior surface of the etch chamber in excess of about 100 degree Celsius while etching the high-k material layer in the presence of the plasma, and maintaining a substrate temperature between about 100 degree Celsius and about 250 degrees Celsius while etching the high-k material layer in the presence of the plasma.

13 Claims, 5 Drawing Sheets

U.S. PATENT DOCUMENTS

| | | |
|---|---|---|
| 5,188,979 A | 2/1993 | Filipiak |
| 5,200,028 A | 4/1993 | Tatsumi |
| 5,337,207 A | 8/1994 | Jones et al. |
| 5,356,833 A | 10/1994 | Maniar et al. |
| 5,391,244 A | 2/1995 | Kadomura |
| 5,674,782 A | 10/1997 | Lee et al. |
| 6,184,072 B1 | 2/2001 | Kaushik et al. |
| 6,204,141 B1 | 3/2001 | Lou |
| 6,270,568 B1 | 8/2001 | Droopad et al. |
| 6,297,095 B1 | 10/2001 | Muralidhar et al. |
| 6,300,202 B1 | 10/2001 | Hobbs et al. |
| 6,319,730 B1 | 11/2001 | Ramdani et al. |
| 6,323,143 B1 | 11/2001 | Yu |
| 6,326,261 B1 | 12/2001 | Tsang et al. |
| 6,348,386 B1 | 2/2002 | Gilmer |
| 6,855,643 B2 | 2/2005 | Nallan et al. |
| 2005/0164511 A1 | 7/2005 | Chen et al. |
| 2006/0046496 A1* | 3/2006 | Mui et al. .................. 438/710 |
| 2006/0105575 A1* | 5/2006 | Bailey et al. ............... 438/706 |
| 2006/0252265 A1* | 11/2006 | Jin et al. .................... 438/689 |
| 2007/0026611 A1* | 2/2007 | Saito et al. ................. 438/261 |
| 2007/0042601 A1* | 2/2007 | Wang et al. ............... 438/689 |
| 2007/0202700 A1* | 8/2007 | Leucke et al. ............. 438/689 |

FOREIGN PATENT DOCUMENTS

| | | |
|---|---|---|
| JP | 60154622 | 8/1985 |
| JP | 06275564 A | 9/1994 |
| JP | 2007501533 A | 1/2007 |
| JP | 200773952 A | 3/2007 |
| JP | 2007529895 A | 10/2007 |
| KR | 20060028636 A | 3/2006 |
| WO | WO-01/97257 | 12/2001 |
| WO | WO-2004109772 A2 | 12/2004 |
| WO | WO-2005094244 A2 | 10/2005 |

OTHER PUBLICATIONS

Office Action From CIPO for Application No. 200810127585.8, Dated November 6, 2009.

Official Letter from Korean Intellectual Property Office for corresponding Korean Patent Application No. 10-2008-0061782 dated May 28, 2010. A concise statement of relevance is provided.

Visokay, et al., "Application of HfSiON as a Gate Dielectric Material", Applied Physics Letters, vol. 80, No. 17, Apr. 29, 2002, pp. 3183-3185.

Yee, et al, "Reactive Radio Frequency Sputter Deposition of Higher Nitrides of Titanium, Zirconium, and Hafnium", J. Vac. Sci. Technol. A 4 (3) May/Jun. 1986, pp. 381-387.

Official Letter from The State Intellectual Property Office of The People's Republic of China for corresponding Chinese Patent Application No. 200810127585.8 dated Feb. 1, 2011.

Official Letter dated Feb. 28, 2013 from the Japanese Patent Office for corresponding Japanese Patent Application No. 2008-164459.

* cited by examiner

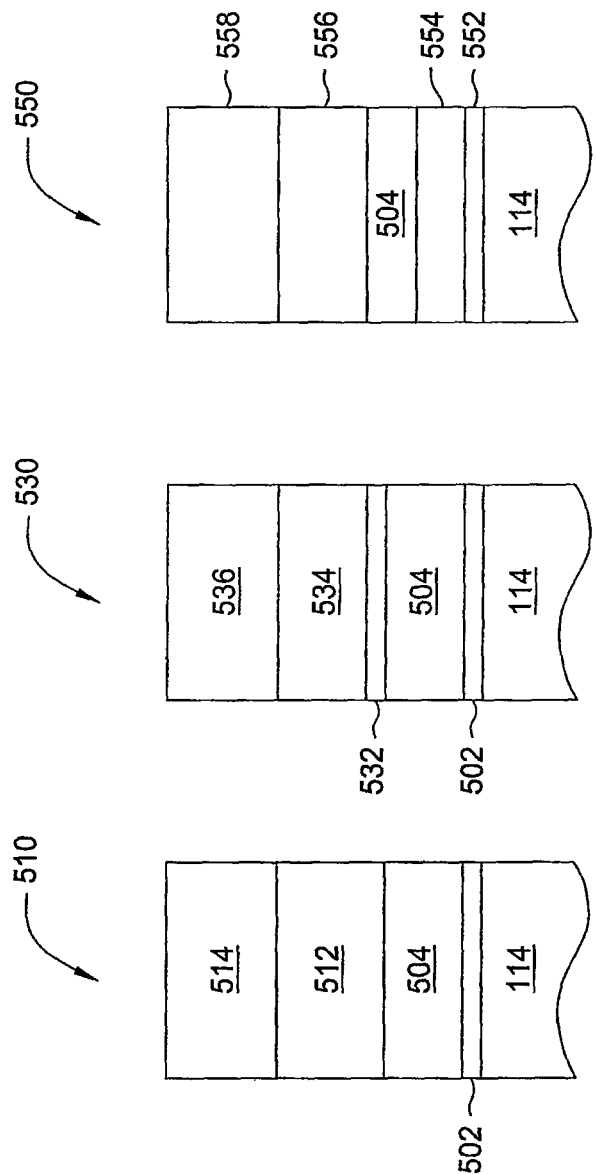

METHODS FOR HIGH TEMPERATURE ETCHING A HIGH-K MATERIAL GATE STRUCTURE

CROSS-REFERENCE TO RELATED APPLICATIONS

This application claims benefit of U.S. Provisional Application Ser. No. 60/946,581, filed Jun. 27, 2007 and U.S. Provisional Application Ser. No. 60/987,159, filed Nov. 12, 2007, both of which are incorporated by reference in their entirety.

BACKGROUND

1. Field of the Invention

Embodiments of the present invention generally relates to methods for high temperature etching of high-k materials, more specifically, for high temperature etching high-k materials during the fabrication of gate structures.

2. Description of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of gate pattern is important to VLSI and ULSI success and to the continued effort to increase circuit density and quality of individual substrates and die. Typically, a gate structure comprises a gate electrode disposed over a gate dielectric layer. The gate structure is utilized to control a flow of charge carriers in a channel region formed between the drain and source regions beneath the gate dielectric layer.

High-k dielectric materials (e.g., materials having a dielectric constant greater than 4) have been widely applied as the gate dielectric layer in the gate structure applications. High-k gate dielectric materials provide a low equivalent oxide thickness (EOT) and reduced gate leakage. Although most high-k materials are relatively stable at ambient temperatures, these materials have proven to be difficult to etch during a gate structure manufacture sequence. Additionally, conventional etchants have low selectivity to etch high-k materials over other materials present in the gate structure, such as gate electrode and/or underlying materials, thereby leaving silicon recess, foot, or other associated defects on the interface of the high-k materials over other materials.

Therefore, there is a need in the art for improved methods for etching high-k materials during fabrication of a gate structure.

SUMMARY

Methods for etching high-k materials disposed in gate structures are provided in the present invention. In one embodiment, a method of etching a high-k material may include providing a substrate having a high-k material layer disposed thereon into an etch chamber, forming a plasma from an etching gas mixture including at least a halogen containing gas into the etch chamber, and maintaining a substrate temperature between about 100 degree Celsius and about 250 degrees Celsius while etching the high-k material layer in the presence of the plasma.

In another embodiment, a method of etching a film stack for forming a gate structure may include providing a substrate having a film stack formed thereon in an etch chamber, wherein the film stack includes a high-k material sandwiched between a first and a second polysilicon layers, etching the first polysilicon layer on the substrate to form a trench exposing the high-k material, forming a protection layer on the sidewalls of the trench, etching the high-k material through the protected trench by a halogen containing gas at a temperature between about 100 degrees Celsius and about 250 degrees Celsius, and etching the second polysilicon layer disposed on the substrate.

In yet another embodiment, a method of etching a film stack for forming a gate structure may include providing a substrate having a film stack formed thereon in an etch chamber, wherein the film stack includes a hafnium oxide containing layer sandwiched between a first and a second polysilicon layers, and sequentially etching the first polysilicon layer, the hafnium oxide containing layer and the second polysilicon layer in the etch chamber while maintaining the substrate at a temperature between about 100 degrees Celsius and about 250 degrees Celsius.

In still another embodiment, a method of etching a film stack for forming a gate structure may include providing a substrate having a metal gate electrode disposed on a high-k material layer formed on the substrate into an etch chamber, etching the metal gate electrode layer to form a trench exposing the high-k material, and etching the high-k material through the trench by a halogen containing gas at a temperature between about 100 degrees Celsius and about 250 degrees Celsius.

In one embodiment, a method of etching high-k material on a substrate may include providing a substrate having a high-k material layer disposed thereon into an etch chamber, forming a plasma from an etching gas mixture including at least a halogen containing gas into the etch chamber, maintaining a temperature of an interior surface of the etch chamber in excess of about 100 degree Celsius while etching the high-k material layer in the presence of the plasma, and maintaining a substrate temperature between about 100 degree Celsius and about 250 degrees Celsius while etching the high-k material layer in the presence of the plasma.

BRIEF DESCRIPTION OF THE DRAWINGS

The teachings of the present invention can be readily understood by considering the following detailed description in conjunction with the accompanying drawings, in which:

FIGS. 5A-C are diagrams illustrating alternative cross-sectional views of different film stack configured to form a gate structures.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The invention generally relates to methods for etching a high-k material that is part of a film stack suitable for gate structure fabrication. In one embodiment, the high-k material of the gate structure film stack is etched at a temperature between about 100 degrees Celsius and about 250 degrees Celsius. In another embodiment, the high-k material along with an adjacent gate electrode layer are both etched at the similar temperature between about 100 degrees Celsius and about 250 degrees Celsius. The process described herein is advantageously suitable for high-k containing gate structure applications having submicron critical dimensions. The process also preserves a smooth, vertical, foot-free, zero silicon recess and straight profile of the formed gate structure. The etching process may be sequentially performed in a single etching chamber.

The etch process described herein may be performed in any suitable plasma etch chamber, for example, a Decoupled Plasma Source (DPS), DPS-II, DPS-II AdvantEdge HT, DPS Plus, or DPS DT, HART, a HART TS etch reactor, all available from Applied Materials, Inc. of Santa Clara, Calif. The invention may also be practiced in suitable plasma etch reactors available from other manufacturers.

Figure 1:
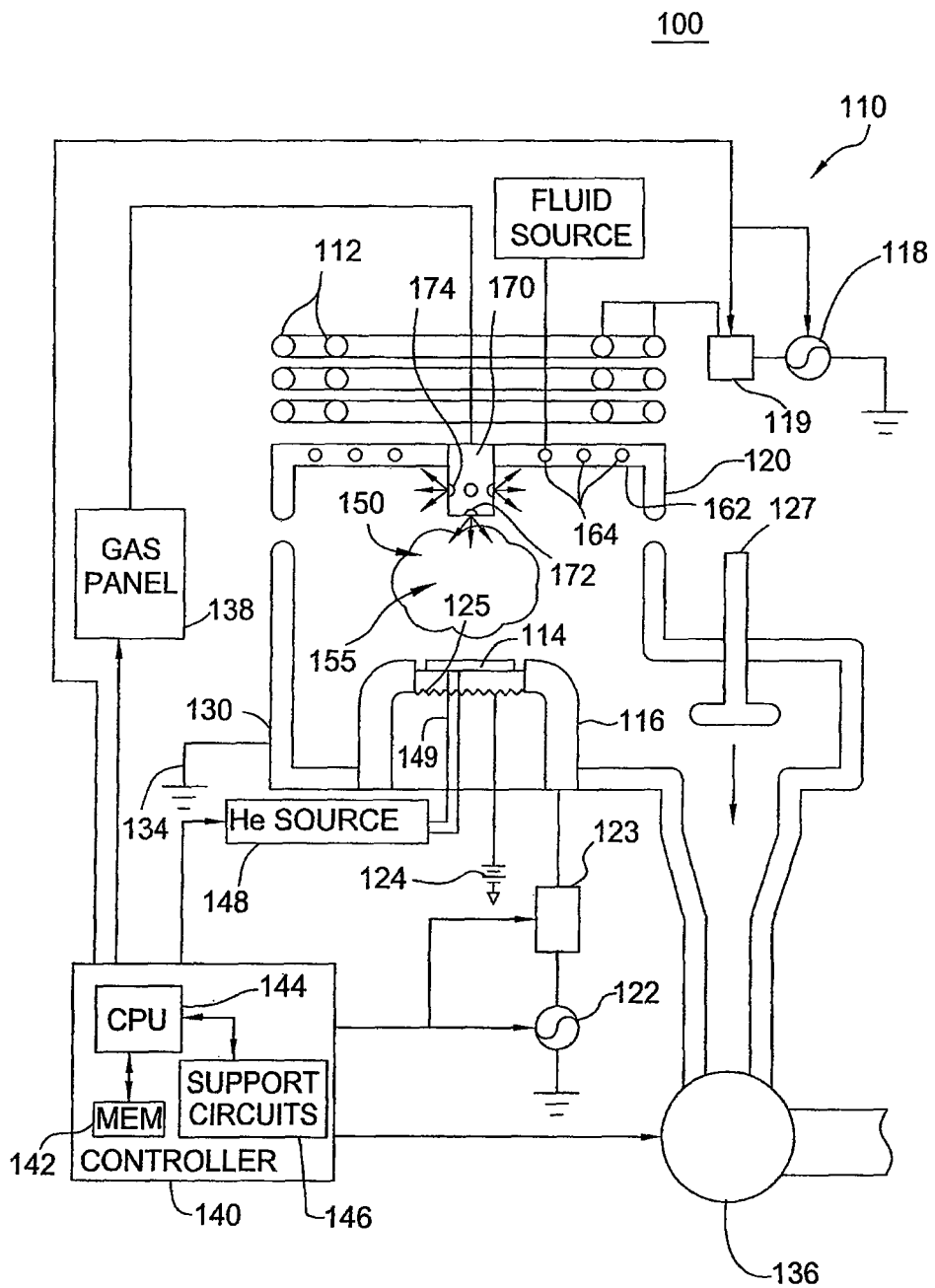
FIG. 1 is a schematic diagram of a plasma processing apparatus used in performing the etching processed according to one embodiment of the invention.

FIG. 1 depicts a schematic diagram of one embodiment of an illustrative etch process chamber 100 suitable for practicing at least one embodiment of the invention. The chamber 100 includes a conductive chamber wall 130 that supports a lid 120. The wall 130 is connected to an electrical ground 134. The lid 120 may provide a flat ceiling, a domed ceiling or other geometry ceiling defining an upper boundary for the interior volume of the process chamber 100.

At least one inductive coil antenna segment 112 is coupled to a radio-frequency (RF) source 118 through a matching network 119. The antenna segment 112 is positioned exterior to a lid 120 and is utilized to maintain a plasma 155 formed from process gases within the chamber. In one embodiment, the source RF power applied to the inductive coil antenna 112 is in a range between about 0 Watts to about 2500 Watts at a frequency between about 50 kHz and about 13.56 MHz. In another embodiment, the source RF power applied to the inductive coil antenna 112 is in a range between about 200 Watts to about 2000 Watts, such as at about 800 Watts.

The lid 120 may include one or more temperature control elements suitable for controlling the temperature of an inner surface 162 of the lid 120 during processing. In one embodiment, the temperature control elements include one or more conduits 164 configured to flow a fluid therethrough. The temperature of the fluid circulated through the conduits 164 may be regulated in a manner to control the temperature of the inner surface 162 of the lid 120 by selectively heating or cooling the lid 120 as necessary to maintain a predefined temperature. Alternatively, the control elements may be resistive heaters, lamps and/or cooling devices.

The process chamber 100 also includes a substrate support pedestal 116 (biasing element) that is coupled to a second (biasing) RF source 122 that is generally capable of producing an RF signal to generate a bias power about 1500 Watts or less (e.g., no bias power) at a frequency of approximately 13.56 MHz. The biasing source 122 is coupled to the substrate support pedestal 116 through a matching network 123. The bias power applied to the substrate support pedestal 116 may be DC or RF.

In operation, a substrate 114 is placed on the substrate support pedestal 116 and is retained thereon by conventional techniques, such as electrostatic chucking, vacuum, or mechanical clamping. Gaseous components are supplied from a gas panel 138 to the process chamber 100 through entry ports to form a gaseous mixture 150. The plasma 155 is formed from the gaseous mixture 150. In one embodiment, the entry ports are contained in a nozzle 170 positioned in the lid 120 of the process chamber 100. The nozzle 170 includes at least a first outlet 172 for supplying a first gaseous component directed downwards towards the center of the substrate 114 and at least second outlet 174 for supplying a second gaseous component directed radially outwards towards the walls 130 of the process chamber 100. In this manner, distribution of first and second gaseous components of the gas mixture may be controlled radially between the center and edge of the substrate. A plasma, formed from the mixture 150, is maintained in the process chamber 100 by applying RF power from the RF sources 118 and 122, respectively, to the antenna 112 and the substrate support pedestal 116. The pressure within the interior of the etch chamber 100 is controlled using a throttle valve 127 situated between the chamber 100 and a vacuum pump 136. The temperature at the surface of the chamber walls 130 is controlled using liquid-containing conduits (not shown) that are located in the walls 130 of the chamber 100.

The temperature of the substrate 114 is controlled by stabilizing the temperature of the support pedestal 116 and flowing a heat transfer gas from source 148 via conduit 149 to channels defined between the back of the substrate 114 and grooves (not shown) on the pedestal surface. Helium gas may be used as the heat transfer gas to facilitate heat transfer between the substrate support pedestal 116 and the substrate 114. During the etch process, the substrate 114 is heated by a resistive heater 125 disposed within the substrate support pedestal 116 to a steady state temperature via a DC power source 124. Helium disposed between the pedestal 116 and substrate 114 facilitates uniform heating of the substrate 114. Using thermal control of both the lid 120 and the substrate support pedestal 116, the substrate 114 may be maintained at a temperature of between about 100 degrees Celsius and about 500 degrees Celsius.

Those skilled in the art will understand that other forms of etch chambers may be used to practice the invention. For example, chambers with remote plasma sources, microwave plasma chambers, electron cyclotron resonance (ECR) plasma chambers, and the like may be utilized to practice the invention.

A controller 140, including a central processing unit (CPU) 144, a memory 142, and support circuits 146 for the CPU 144 is coupled to the various components of the DPS etch process chamber 100 to facilitate control of the etch process. To facilitate control of the chamber as described above, the CPU 144 may be one of any form of general purpose computer processor that can be used in an industrial setting for controlling various chambers and subprocessors. The memory 142 is coupled to the CPU 144. The memory 142, or computer-readable medium, may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. An etching process, such as described herein, is generally stored in the memory 142 as a software routine. The software routine may also be stored and/or executed by a second CPU (not shown) that is remotely located from the hardware being controlled by the CPU 144.

Figure 2:
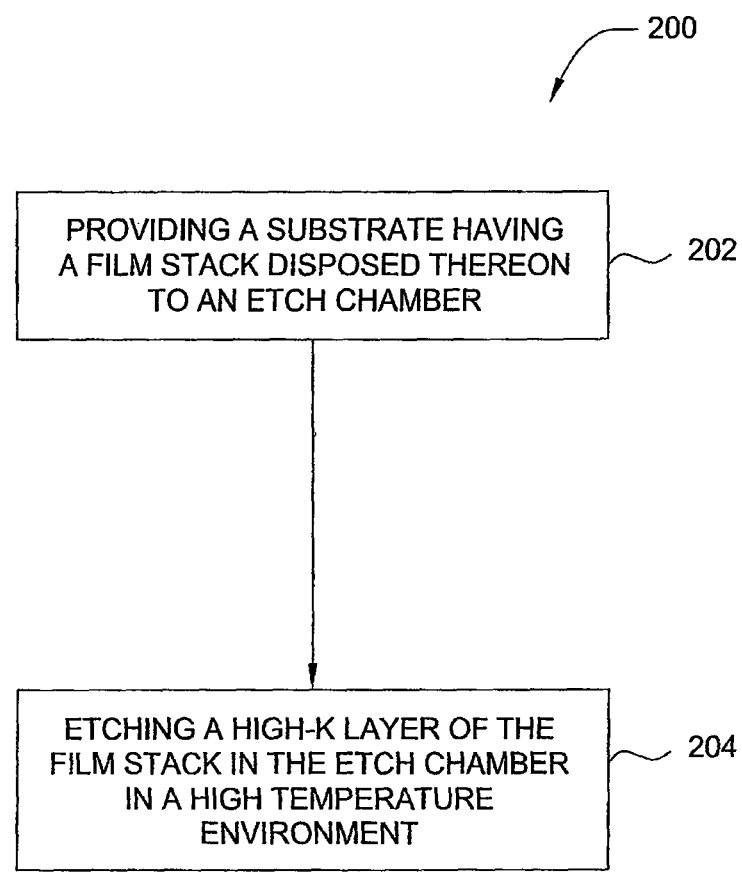
FIG. 2 is a process flow diagram illustrating a method incorporating one embodiment of the invention.

FIG. 2 is a flow diagram of one embodiment of an etch process 200 that may be practiced in the illustrative chamber 100 or other suitable processing chamber. The process 200 begins at block 202 by transferring (i.e., providing) a substrate 114 to an etch process chamber, such as the illustrative process chamber 100 as depicted in FIG. 1. The substrate 114 has a film stack disposed thereon containing a high-k material dielectric layer. In one embodiment, the high-k material layer is at least one of hafnium dioxide (HfO2), zirconium dioxide (ZrO2), hafnium silicate oxide (HfSiO4), hafnium aluminum oxide (HfAlO), zirconium silicate oxide (ZrSiO4), tantalum dioxide (TaO2), aluminum oxide, aluminum doped hafnium dioxide, bismuth strontium titanium (BST), or platinum zirconium titanium (PZT), among others. Portions of the high-k material dielectric layer are exposed through a patterned masking layer. The substrate 114 may be any one of semiconductor substrates, silicon wafers, glass substrates and the like.

At block 204, the exposed high-k material layer is plasma etched through openings defined by the patterned masking layer in a high temperature environment. The high-k material layer is etched until an upper surface of an underlying layer of the film stack is exposed. The high-k material layer is etched at in a high temperature environment. Specifically, at least some of the chamber components are maintained at a temperature greater than about 100 degrees Celsius during etching of the high-k material layer. During conventional high-k etching processes which are performed at room temperature, the etched high-k material by-products generated during etching tend to condense on the relatively cool chamber surfaces rather than forming volatile gases which may be pumped out of the chamber. In one embodiment, the lid 120 is maintain during etching at a temperature between about 100 degrees Celsius and about 250 degrees Celsius so that the electrically insulative high-k etching by-products do not condense on the lid 120 where they would hamper the coupling of power to the plasma uses to drive the etching process. Thus, by maintaining the lid 120 in a substantially clean condition, more uniform and precise plasma control is effectuated, thereby resulting in more predictable, uniform and accurate etching performance.

Additionally, the temperature of the high-k material layer being etched is maintained at a temperature about greater than about 80 degrees Celsius. In one embodiment, the temperature of the high-k material layer is maintained using a heated substrate support between about 100 degrees Celsius to about 250 degrees Celsius, for example, between about 130 degrees Celsius and about 220 degrees Celsius, such as about 150 degrees Celsius. As noted above, by controlling the etching temperature at a temperature between about 100 degrees Celsius and about 250 degrees Celsius, the high-k etching by-products can be readily formed as volatile products, pumped out and removed from the chamber, thereby resulting in more accurate profiles and pattern transfer. Forming volatile product also promotes residue evacuation from the chamber to leave a clean post-etch surface on the substrate 114. Furthermore, as the substrate temperature controlled for etching high-k material layer is substantially higher than conventional techniques, no bias power may be needed to sustain a reasonable high-k material etching rate, thereby avoiding bombardment that may produce the undesirable recesses or surface damage in the underlying layers and/or the substrate.

The high-k material layer is etched in the presence of a plasma formed from a process gas mixture. In one embodiment, the process gas mixture includes at least a halogen containing gas. In an exemplary embodiment, the halogen containing gas may be a chlorine containing gas. Suitable examples of the halogen containing gas include $BCl_3$, $Cl_2$ and the like. The halogen element provided in the halogen containing gas etches the high-k material layer and removes the high-k material layer from the substrate 114. In embodiments wherein the high-k material layer contains hafnium, chlorine elements released from the process gas reacts with hafnium elements released from the hafnium containing material, thereby forming hafnium chlorine ($HfCl_4$), which is a volatile by-product that readily pumps out of the process chamber. As the high temperature high-k etching process increases the by-product volatility, the etching by-product may be efficiently removed from the substrate support and lid (or other high temperature chamber surface), leaving the surfaces clean and residual free after the etching process.

Optionally, a hydrocarbon gas may be supplied in the process gas. The hydrocarbon gas provides polymeric materials that deposit upon the sidewalls of the etched high-k material layer and masking layer during the etching process. This improves critical dimension and profile control. Examples of the hydrocarbon gas include $CH_4$, $CHF_3$, $CH_2F_2$, and combinations thereof.

Several process parameters may be regulated while etching the high-k material layer. In one embodiment, the chamber pressure in the presence of the high-k etching process gas is regulated between about 2 mTorr to about 500 mTorr, for example, at about 20 mTorr. RF source power may be applied to maintain a plasma formed from the high-k etching process gas. For example, a power of about 0 Watts to about 1500 Watts may be applied to an inductively coupled antenna source to maintain a plasma inside the etch chamber. RF bias power may be applied between about 0 Watts to about 1000 Watts, such as about 250 Watts. In one embodiment, no bias power is used which reduces ion bombardment, thus greatly diminishing the occurrence of undesirable recesses in the silicon source and drain beneath the gate. Alternatively, the bias power may be eliminated as needed. The high-k etching process gas may be flowed into the chamber at a rate between about 0 sccm to about 500 sccm. For example, the halogen containing gas may be supplied at a flow rate between about 5 sccm and about 500 sccm, such as between about 30 sccm and about 100 sccm. The hydrocarbon gas may be supplied at a flow rate between about 0 sccm and about 100 sccm, such as between about 0 sccm and about 10 sccm. The inert gas may be supplied at a flow rate between about 0 sccm and about 500 sccm. The substrate temperature is maintained about greater than 80 degrees Celsius, such as greater than about 120 degrees Celsius, for example, about 150 degrees Celsius.

Figure 3:
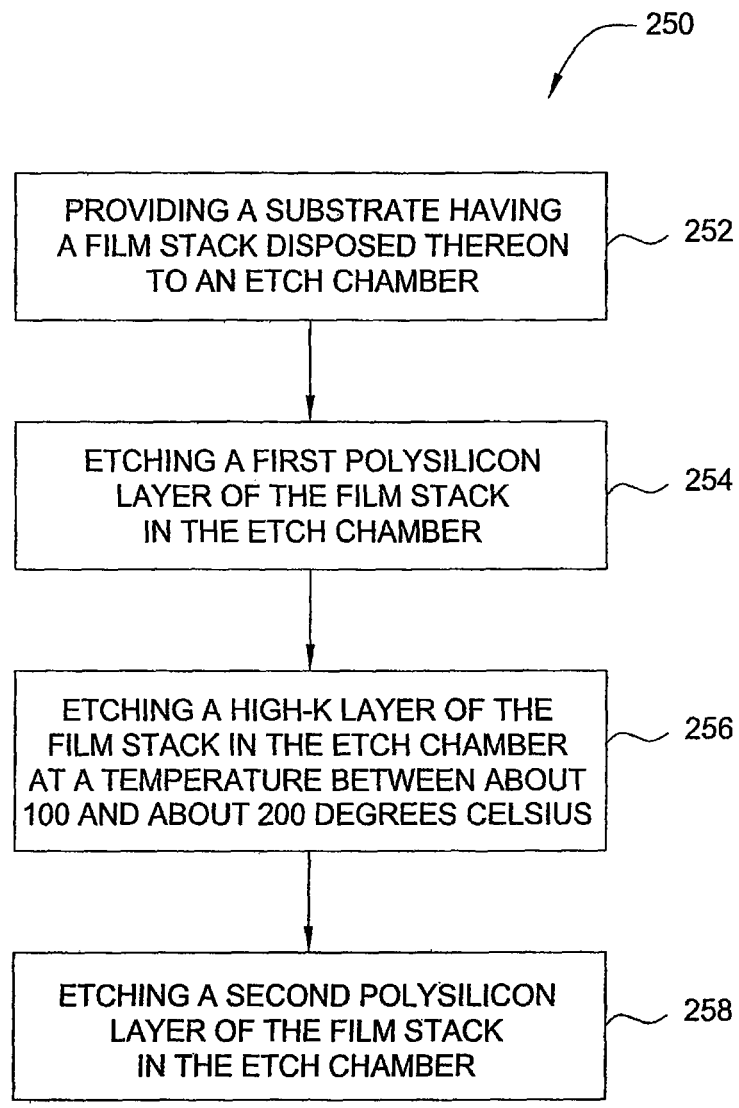
FIG. 3 is a process flow diagram illustrating a method incorporating another embodiment of the invention.

FIG. 3 is a flow diagram of one embodiment of an etch process 250 that may be practiced in the illustrative chamber 100 or other suitable processing chamber. FIGS. 4A-4D are schematic cross-sectional views of a portion of a composite substrate corresponding to various stages of the process 250. Although the process 250 is illustrated for forming a gate structure in FIGS. 4A-4D, the process 250 may be beneficially utilized to fabricate other structures.

The process 250 begins at block 252 by transferring (i.e., providing) a substrate 114 to an etch process chamber, such as the illustrative process chamber 100 as depicted in FIG. 1. In the embodiment depicted in FIG. 4A, the substrate 114 has a film stack 300 containing a high-k material dielectric layer 304 disposed thereon suitable for fabricating a gate structure. The substrate 114 may be any one of semiconductor substrates, silicon wafers, glass substrates and the like. The layers that comprise the film stack 300 may be formed using one or more suitable conventional deposition techniques, such as atomic layer deposition (ALD), physical vapor deposition (PVD), chemical vapor deposition (CVD), plasma enhanced CVD (PECVD), and the like.

In one embodiment, the film stack 300 includes at least one or more layers 302, 306 sandwiching the high-k dielectric material layer 304 (high-k materials have dielectric constants greater than 4.0). The film stack 300 may be disposed on a dielectric layer (not shown) or directly on the substrate 114. Suitable examples of dielectric layers include, but not limited to, an oxide layer, a nitride layer, titanium nitride layer, a composite of oxide and nitride layer, at least one or more oxide layers sandwiching a nitride layer, and combinations thereof, among others. A patterned mask 308, e.g., a hard mask, photoresist mask, or the combination thereof, may be used as an etch mask exposing portions of the film stack 300 via opening 310 for etching features thereon.

Figure 4A:
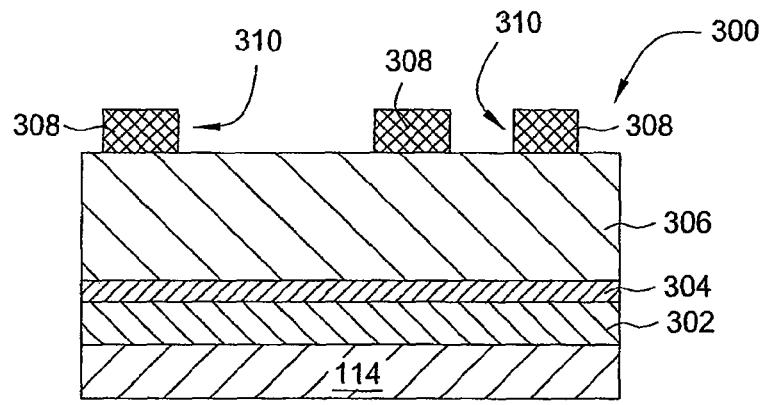
FIGS. 4A-4D are diagrams illustrating a cross-sectional view of a film stack configured to form a gate structure thereon.

In the embodiment depicted in FIG. 4A, the high-k material layer 304 may be a layer of hafnium dioxide ($HfO_2$), zirconium dioxide ($ZrO_2$), hafnium silicate oxide ($HfSiO_4$), hafnium aluminum oxide (HfAlO), zirconium silicate oxide ($ZrSiO_4$), tantalum dioxide ($TaO_2$), aluminum oxide, aluminum doped hafnium dioxide, bismuth strontium titanium (BST), or platinum zirconium titanium (PZT), among others. In an exemplary embodiment, the high-k material is hafnium aluminum oxide (HfAlO). The high-k material layer 304 has a thickness between about 10 Å and about 500 Å, such as about 50 Å and about 300 Å, for example, about 150 Å.

The first layer 306 is disposed above the high-k material layer 304 and may comprise one or more layers. In one embodiment, the first layer 306 is a polysilicon layer utilized as a gate electrode layer in the gate structure. Alternatively, the first layer 306 may be a metal material utilized for the gate electrode. Examples of metal gate electrode include tungsten (W), tungsten silicide (WSi), tungsten polysilicon (W/poly), tungsten alloy, tantalum (Ta), tantalum nitride (TaN), tantalum silicon nitride (TaSiN), and titanium nitride (TiN), among others. In yet another embodiment, the gate electrode layer 306 may be a composite film including a polysilicon layer disposed on a metal material. In this particular embodiment, the gate electrode layer 306 may be a polysilicon layer disposed on a titanium nitride (TiN) layer. In the embodiment depicted in FIG. 4A, the first layer 306 disposed on the high-k material layer 304 is a polysilicon layer. The first layer 306 may have a thickness between about 500 Å and about 4000 Å, such as between about 800 Å and about 2500 Å, for example, about 1650 Å.

The second layer 302 is disposed below the high-k material layer 304 and may also include one or more layers. In one embodiment, the second layer 302 may be a dielectric layer, such as a polysilicon layer, a silicon oxide layer, a silicon nitride layer, a silicon oxynitride or combinations thereof. In some embodiments wherein the second layer 302 is not present, the high-k material layer 304 in the film stack 300 may be directly disposed on the substrate 114. In the embodiment depicted in FIG. 4A, the second layer 302 is a polysilicon layer and has a thickness between about 50 Å and about 2000 Å, such as between about 100 Å and about 1000 Å, for example, about 500 Å.

Figure 4B:
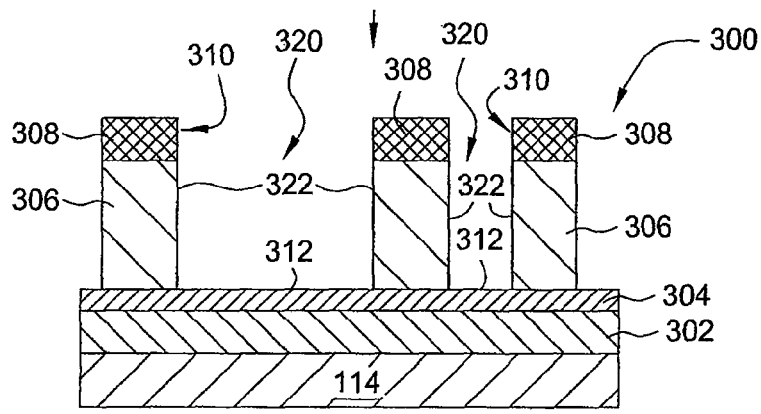

At block 254, an etching process is performed to etch the first layer 306 on the substrate 114 through the openings 310 defined by the patterned mask 308 to form trenches 320 in the first layer 306, as shown in FIG. 4B. The etching process performed at block 254 may have one or more etching steps to etch different portions of the first layer 306. In one embodiment, the etching process may be a single step etching process, one-step etching the first layer 306 until the high-k material layer 304 is exposed. In another embodiment, the etching process may include multiple steps to etch different portions of the first layer 306 on the substrate 114.

In an exemplary embodiment, multiple etching steps may be performed to etch the first layer 306 and expose the high-k material layer 304 of the film stack 300. A breakthrough etch may be initially performed to etch the upper surface, e.g. native oxide, of the first layer 306. The etching gas mixture for the break-through etch includes a fluorine and carbon gas. The reactive species generated from a plasma formed from gas mixture react with the native oxide, such as silicon oxide, to form the volatile reaction products, such as $SiF_4$ and $CO_2$, which are pumped out of the processing chamber. Suitable examples of the etching gas mixture for the break-through etch include $CF_4$, $CHF_3$, $CH_2F_2$, $CH_3F$, $C_4F_8$ and the like. Optionally, an inert gas may be supplied with the etching gas mixture. Suitable examples of the inert gas include Ar, He, Kr, Ne, and the like.

The chamber pressure in the presence of the etching gas mixture during the break-through etch is regulated. In one exemplary embodiment, a process pressure in the etch chamber is regulated between about 2 mTorr to about 100 mTorr, for example, at about 4 mTorr. RF source power may be applied to maintain a plasma formed from the etching gas mixture. For example, a power of about 100 Watts to about 1500 Watts, such as about 300 Watts, may be applied to an inductively coupled antenna source to maintain a plasma inside the etch chamber. RF bias power may be applied between about 100 Watts to about 1500 Watts, such as about 100 Watts. The etching gas mixture for the break-through etch may be flowed into the chamber at a rate between about 50 sccm to about 1000 sccm. For example, the fluorine and carbon gas may be supplied at a flow rate between about 5 sccm and about 500 sccm, such as 100 sccm. The inert gas may be supplied at a flow rate between about 0 sccm and about 500 sccm. Substrate temperature is maintained between about 30 degrees Celsius to about 500 degrees Celsius. In another embodiment, the substrate temperature is maintained about greater than 80 degrees Celsius, such as between about 100 degrees Celsius to about 250 degrees Celsius, for example, between about 130 degrees Celsius and about 220 degrees Celsius, such as about 150 degrees Celsius.

After the native oxide is broken through, a main etch is performed to etch the main portion of the first layer 306. The first layer 306 is etched through the patterned mask 308 to form trenches 320 in the first layer 306 until an upper surface 312 of the underlying high-k material 304 is exposed. The break-through and main etch may be consecutively performed without removing the substrate 114 from the etching chamber. The etching gas mixture for the main etching step includes at least a halogen containing gas and a fluorine and carbon gas. Suitable examples of halogen containing gas include HBr, HCl, $Cl_2$, $Br_2$, $NF_3$, combinations thereof, and the like. Suitable examples for the fluorine and carbon gas include $CF_4$, $CHF_3$, $CH_2F_2$, $CH_3F$, $C_4F_8$, combinations thereof, and the like. Optionally, a carrier gas, such as $O_2$, $N_2$, combinations thereof, and the like, and an inert gas may be supplied with the etching gas mixture. Suitable examples of the inert gas include Ar, He, Kr and the like. In a particular embodiment, the main etch gas mixture may include HBr gas, $NF_3$ gas, $CF_4$ gas, $O_2$ gas, $N_2$ gas and He gas.

In one embodiment, process parameters utilized to etch the first layer 306 during the breakthrough and main etch may be controlled in a substantially similar manner. In another embodiment, process parameters utilized to etch the first layer 306 during the break-through etch and the main etch may be varied in accordance with different process requirements. Furthermore, in yet another embodiment, the process parameters during the main etch of the first layer 306 may be varied as needed, thereby rendering the main etch process into a two or more step etch process.

In one embodiment, the chamber pressure of the main etch gas mixture is regulated during etching of the first layer 306. In one exemplary embodiment, a process pressure in the etch chamber is regulated between about 2 mTorr to about 100 mTorr, for example, at about 7 mTorr. RF source power may be applied to maintain a plasma formed from the etching gas mixture. For example, a power of about 100 Watts to about 1500 Watts, such as about 300 Watts, may be applied to an inductively coupled antenna source to maintain a plasma inside the etch chamber. RF bias power may be applied between about 100 Watts to about 1000 Watts, such as about 150 and about 250 Watts. The etching gas mixture during the main etch may be flowed into the chamber at a rate between about 50 sccm to about 1000 sccm. For example, the halogen containing gas may be supplied at a flow rate between about 5 sccm and about 500 sccm, such as 170 sccm. The fluorine and carbon gas may be supplied at a flow rate between about 5 sccm and about 500 sccm, such as between about 40 and about 70 sccm. The inert gas may be supplied at a flow rate between about 0 sccm and about 500 sccm. A substrate temperature is maintained between about 30 degrees Celsius to about 500 degrees Celsius. In another embodiment, the substrate temperature is maintained about greater than 80 degrees Celsius, such as greater than about 120 degrees Celsius, for example, about 150 degrees Celsius.

After the trenches 320 are formed in the first layer 306, as shown in FIG. 4B, an over-etching process may be performed to etch the topography of the first layer 306 remaining on the substrate 114 as well as deposit a protective layer on the sidewalls 322 of the etched first layer 306. The protective layer disposed on the exposed sidewalls 322 prevents the sidewalls from being attacked while etching the topography of the first layer 306 remaining on the substrate 114 and/or during the subsequent etching processes, thereby preventing loss of profile control and pattern deformation.

In one embodiment, in addition to the gas mixture used at main etch process of etching the first layer 306 at block 254, a silicon and halogen containing gas may be added to etch the topography of the first layer 306 remaining on the substrate 114. Suitable example of gas added into the gas mixture includes $SiCl_4$ and the like. The halogen reactive species generated from silicon and halogen containing gas removes the etch residuals and remaining first layer 306 from the substrate surface. Additionally, the silicon reactive species generated from the silicon and halogen containing gas react with the first layer 306, forming a silicon sidewall protective layer on the etched surface, thereby providing a robust sidewall protection. This robust sidewall protection protects the first layer 306 from being attack during the subsequent etching of the high-k material layer 304 and underlying second layer 302 etching process.

Figure 4C:
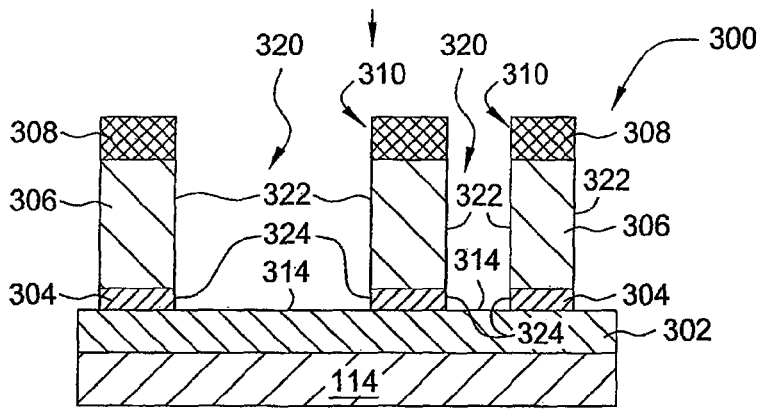

At block 256, the exposed upper surface 312 of the high-k material layer 304 is etched in a high temperature environment through openings 310 defined by the patterned mask 308 and trenches 320. The high-k material layer 304 is etched until the upper surface 314 of the underlying second layer 302 is exposed, as shown in FIG. 4C. In one embodiment, the high temperature environment is provided by maintaining the lid 120 of the process chamber 100 between about 100 to about 150 decrees Celsius, such as about 120 decrees Celsius.

A high-k etching gas mixture utilized for etching the high-k material layer 304 is selected to have a high selectivity for the high-k material layer 304 over silicon protection layer covering the sidewall 322 of the first layer 306 and the underlying second layer 302. As the sidewall 322 of the first layer 306 is protected by the robust protection layer, a relatively higher process temperature, e.g., higher than room temperature processes used in conventional techniques, may be used to etch the high-k material layer 304 without adversely damage the trench profile formed in the first layer 306. In one embodiment, the high-k material layer 304 is etched at a temperature about greater than about 80 degrees Celsius, such as between about 100 degrees Celsius to about 250 degrees Celsius, for example, between about 130 degrees Celsius and about 220 degrees Celsius, such as about 150 degrees Celsius. During conventional high-k etching process which are performed at room temperature, the etched high-k material by-products generated during etching tend to accumulate on the substrate surface rather than forming volatile reaction products which may be pumped out of the chamber, thereby resulting in poor pattern transfer. Therefore, by controlling the etching temperature at a temperature between about 100 degrees Celsius and about 250 degrees Celsius, the high-k etching by-products can be readily formed as volatile products, pumped out and removed from the chamber, thereby resulting in more accurate profiles and pattern transfer. Forming volatile product also promotes residue evacuation from the chamber to leave a clean post-etch surface on the substrate 114. Furthermore, as the substrate temperature controlled for etching high-k material layer 304 is substantially higher than conventional techniques, no bias power may be needed to sustain a reasonable high-k material etching rate, thereby avoiding bombardment that may produce the undesirable recesses or surface damage in the underlying layers and/or the substrate.

In one embodiment, the high-k gas mixture supplied to etch the high-k material layer 304 includes at least a halogen containing gas. In an exemplary embodiment, the halogen containing gas may be a chlorine containing gas. Suitable examples of the halogen containing gas include $BCl_3$, $Cl_2$ and the like. The halogen element provided in the halogen containing gas etches the high-k material layer 304 and removes the high-k material layer 304 from the substrate 114. In the embodiment wherein halogen containing gas is $BCl_3$, the halogen containing gas provides a high selectivity between the material 304 and the underlying first layer 306. For example, in the embodiment wherein the high-k material layer 304 is a hafnium and oxide containing material, the boron element released from the $BCl_3$ gas during etching plasma dissociation reacts with the oxygen element released from the hafnium and oxide containing material, thereby forming a $B_xO_y$ protective layer on the exposed surface of the substrate. The $B_xO_y$ protective layer formed during the etching process passivates the silicon surface, e.g., etched upper layer or early exposed underlying layer, thereby preventing other regions undesired to be etched on the substrate from being attacked during etching, resulting in recess or defects on the substrate. The chlorine element released from the $BCl_3$ gas reacts with the hafnium element released from the hafnium and oxide containing material, thereby forming hafnium chlorine ($HfCl_4$) volatile by-product pumping out of the chamber. As the high temperature high-k etching process increases the by-product volatility, the etching by-product may be efficiently removed from the substrate, leaving a post-etch clean and residual free surface on the substrate after the etching process. Accordingly, a high-k etch process capable of providing vertical, straight, defect-free (zero recess and foot free) structure and high selectivity to the adjacent layers is obtained.

Optionally, a hydrocarbon gas may be supplied in the gas mixture. The hydrocarbon gas provides polymeric materials that deposit upon the sidewalls 322 of the first layer 306 and a sidewall 324 of the etched high-k material layer 304, shown in FIG. 4C, while plasma dissociation during the etching process. Examples of the hydrocarbon gas include $CH_4$, $CHF_3$, $CH_2F_2$, and combinations thereof.

In one embodiment, the high-k material 304 may be etched in the same chamber that etches the upper first layer 306, thereby integrating etching of the film stack 300 in a single chamber. The etching process at block 254 and 256 may be performed consecutively without removing the substrate 114 from the processing chamber 100. The temperature selected to etch the first layer 306 may be controlled substantially the same as the temperature configured to etch the high-k material 304, thereby efficiently etching the substrate 114 without having to wait to change and stabilized substrate temperature. In one embodiment, both the high-k material etching process at block 256 and etching of the first layer 306 at block 254 may be performed at a similar temperature which is greater than 80 degrees Celsius, such as between about 100 degrees Celsius and about 200 degrees Celsius. In one embodiment, the temperature configured to etch both the first layer 306 and the high-k material 304 is controlled at greater than about 80 degrees Celsius, such as between about 100 degrees Celsius to about 250 degrees Celsius, for example, between about 130 degrees Celsius and about 220 degrees Celsius, such as about 150 degrees Celsius.

Several process parameters may be regulated while etching the high-k material layer 304. The process parameters regulated at block 254 may be smoothly transitioned to the process parameters regulated at block 256. In one embodiment, the chamber pressure in the presence of the high-k etching gas mixture is regulated between about 2 mTorr to about 500 mTorr, for example, at about 20 mTorr. RF source power may be applied to maintain a plasma formed from the high-k etching gas mixture. For example, a power of about 0 Watts to about 1500 Watts may be applied to an inductively coupled antenna source to maintain a plasma inside the etch chamber. RF bias power may be applied between about 0 Watts to about 1000 Watts, such as about 250 Watts. In one embodiment, no bias power is used which reduces ion bombardment, thus greatly diminishing the occurrence of undesirable recesses in the silicon source and drain beneath the gate. Alternatively, the bias power may be eliminated as needed. The high-k etching gas mixture may be flowed into the chamber at a rate between about 0 sccm to about 500 sccm. For example, the halogen containing gas may be supplied at a flow rate between about 5 sccm and about 500 sccm, such as between about 30 sccm and about 100 sccm. The hydrocarbon gas may be supplied at a flow rate between about 0 sccm and about 100 sccm, such as between about 0 sccm and about 10 sccm. The inert gas may be supplied at a flow rate between about 0 sccm and about 500 sccm. The substrate temperature is maintained about greater than 80 degrees Celsius, such as greater than about 120 degrees Celsius, for example, about 150 degrees Celsius.

Optionally, an oxygen gas flash process may be performed prior to supplying the high-k gas mixture into the etch chamber at block 256. The oxygen gas flash process assists in the formation of an oxidation layer on the etched sidewalls 322 of the first layer 306, thereby providing a surface passivation layer on the etched surface. As the first layer 306 may be a silicon containing material, the oxygen gas supplied to the chamber reacts with the silicon element in the first layer 306, forming a sidewall silicon oxide protection layer. The process parameters performed at the oxygen gas flash process is regulated. In one embodiment, the chamber pressure is regulated between about 2 mTorr to about 500 mTorr, for example, at about 20 mTorr. RF source power about 200 Watts to about 2000 Watts may be applied to an inductively coupled antenna source to maintain a plasma inside the etch chamber. The oxygen gas may be supplied at a flow rate between about 20 sccm and about 500 sccm, such as between about 50 sccm and about 150 sccm. Alternatively, an inert gas, such as He or Ar, may be supplied at a flow rate between about 0 sccm and about 500 sccm. The substrate temperature is maintained about greater than about 80 degrees Celsius, such as between about 100 degrees Celsius to about 250 degrees Celsius, for example, between about 130 degrees Celsius and about 220 degrees Celsius, such as about 150 degrees Celsius.

Figure 4D:
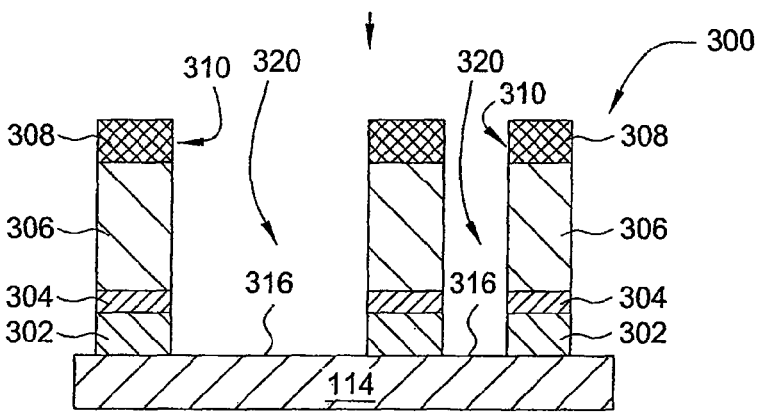

At block 258, the second layer 302 of the film stack 300 is etched through openings 310 defined by the patterned mask 308 and trenches 320. The etching process etches the second layer 302 until the upper surface 316 of the substrate 114 is exposed, as shown in FIG. 4D. The etching process performed at block 258 may have one or more etching steps to etch different portions of the second layer 302, similar to the etching process performed at block 254 to etch the first layer 306. In one embodiment, the etching process may be a single step etching process, etching the second layer 302 until the upper surface 316 of the underlying substrate 114 is exposed. In another embodiment, the etching process may include multiple steps to etch different portions of the second layer 302 on the substrate 114.

In an exemplary embodiment, a two-step etching process may be performed at block 258 to etch the second layer 306 in the film stack 300. First, a break-through etch may be initially performed to etch into the surface of the second layer 302. The etching gas mixture used for the break-through etch includes a fluorine and carbon gas. The break-through gas mixture used to break through the second layer 302 at block 258 may be substantially the same as the break-through gas mixture used to break through the first layer 306 at block 254, as discussed above. Optionally, an inert gas may be supplied with the etching gas mixture. Suitable examples of the inert gas include Ar, He, Kr, Ne, and the like.

After break-through, a main etch is performed to etch the remaining portion of the second layer 306 exposed through the mask openings 310. Break-through and the main etch may be performed consecutively without removing the substrate 114 from the etching chamber. In an embodiment that both the first and the second layer 306, 302 are polysilicon layers, the gas mixtures and process parameters used to etch the main portion of the first and the second layer 306, 302 may be substantially the same. The etching gas mixture for the main etch includes at least a halogen containing gas and a fluorine carbon gas. Suitable examples of halogen containing gas include HBr, HCl, $Cl_2$, $Br_2$, $NF_3$, combinations thereof, and the like. Suitable examples for the fluorine carbon gas include $CF_4$, $CHF_3$, $CH_2F_2$, $CH_3F$, $C_4F_8$, combinations thereof, and the like. Optionally, a carrier gas, such as $O_2$, $N_2$, $N_2O$, $NO_2$, combinations thereof, and the like, and an inert gas may be supplied with the etching gas mixture. Suitable examples of the inert gas include Ar, He, Kr, Ne, and the like. In one embodiment, the etching gas mixture for the main etch step may include HBr gas, $NF_3$ gas, $CF_4$ gas, $O_2$ gas, $N_2$ gas and He gas. The process parameters regulated at block 258 may be controlled substantially similar to as described at block 254.

The second layer 302 in the film stack 300 may be etched at the same chamber that etches the upper first layer 306 and the high-k material 304, thereby integrating the etching of the film stack 300 in a single chamber. Since the first layer 306, the high-k material 304 and the second layer 302 are etched at similar temperatures, throughput is enhanced because less time is requested to bring the substrate to a stably processing temperature for process used to etch each layer.

It is contemplated that other high-k etch processes may able adapted to benefit from etching a high-k material layer in a high temperature environment (e.g., maintaining the chamber surfaces, such as the lid 120, at a temperature greater than about 100 degrees Celsius). Incorporated by reference, but not by way of limitation, high-k etch processes described in U.S. patent application Ser. No. 11/386,054, filed Mar. 21, 2006, U.S. patent application Ser. No. 11/777,259, filed Jul. 12, 2007, U.S. patent application Ser. No. 11/736,562, filed Apr. 17, 2007, U.S. Patent Provisional Application Ser. No. 60/948,376, filed Jul. 6, 2007, and U.S. Pat. No. 6,806,095, filed Mar. 6, 2002 may be modified to include regulation of the temperature of the chamber surfaces as described above to provide a high temperature etching environment.

FIGS. 5A-C depict schematic cross-sectional views of a portion of a composite substrate corresponding different film stacks that may be beneficially etched using the high-k etch processes described above. For example, FIG. 5A depicts a film stack 510 having a high-k dielectric layer 504. The high-k dielectric layer 504 is a hafnium containing material, such as Hf2O, HfSiO, HfSiN and the like. A high mobility interface layer 502 is disposed between the high-k dielectric layer 504 and the substrate 114. The high mobility interface layer 502 is generally a thin SiON layer. The SiON material of the high mobility interface layer 502 may be graded in that the stoichiometry of the layer 502 may include intermixing of Hf with the SiON to provide a higher net k for the entire stack. Examples of suitable interface layers are described in U.S. patent application Ser. No. 10/407,930, filed Apr. 4, 2003, which is incorporated by reference. A metal gate layer 512 is disposed on the high-k dielectric layer 504. A low resistance layer 514 is disposed on the metal gate layer 512.

In another embodiment, FIG. 5B depicts a film stack 530 having a high-k dielectric layer 504. A high mobility interface layer 502 is disposed between the high-k dielectric layer 504 and the substrate 114. A thin dielectric cap layer 532 is disposed on the on the high-k dielectric layer 504. A metal gate layer 534 is disposed on the dielectric cap layer 532. A low resistance layer 536, such as polysilicon, is disposed on the metal gate layer 534.

In another embodiment, FIG. 5C depicts a film stack 550 suitable for charge-trap flash memory devices, for example, a TANOS structure. The film stack 550 includes a tunnel oxide layer 552 disposed on the substrate 114. A charge trap nitride layer 554 is disposed on the tunnel oxide layer 552. A high-k dielectric layer 504 is disposed on the charge trap nitride layer 554. A high WP metal layer 556 is disposed on the high-k dielectric layer 504. A low resistance layer 558, such as a PVD metal layer, is disposed on the high WP metal layer 556.

Thus, the present invention provides an improved method for etching a high-k material layer by a high temperature etching process. The high temperature etching process efficiently etches a high-k material without loss of pattern transfer, thereby advantageously forming a structure with defect free, clean post-etch surface, desired profile and dimension.

While the foregoing is directed to embodiments of the present invention, other and further embodiments of the invention may be devised without departing from the basic scope thereof, and the scope thereof is determined by the claims that follow.

What is claimed is:

1. A method of etching a film stack for forming a gate structure, comprising:

providing a substrate having a film stack formed thereon in an etch chamber, wherein the film stack includes a high-k material sandwiched between a first and a second polysilicon layers;
etching the first polysilicon layer on the substrate to form a trench exposing the high-k material in the etch chamber;
forming a protection layer on the sidewalls of the trench;
etching the high-k material through the protected trench by at least a $BCl_3$ gas without applying a bias power in the etch chamber at a temperature between about 100 degrees Celsius and about 250 degrees Celsius while etching the high-k material layer in the presence of the plasma; and
etching the second polysilicon layer disposed on the substrate while maintaining the substrate temperature between about 100 degree Celsius and about 250 degrees Celsius and the interior surface of the etch chamber at a temperature in excess of about 100 degrees Celsius in the same etch chamber.

2. The method of claim 1 further comprising:
maintaining an interior surface of the etch chamber at a temperature in excess of about 100 degrees Celsius while etching the high-k material layer in the presence of the plasma.

3. The method of claim 1, wherein the high-k material is hafnium oxide layer or hafnium aluminum oxide layer.

4. The method of claim 1, wherein etching the first polysilicon layer further comprising:
supplying a first gas mixture to etch the first polysilicon layer; and
supplying a second gas mixture to over etch the first polysilicon layer.

5. The method of claim 4, wherein supplying the second gas mixture further comprises:
supplying a silicon containing gas with the second gas mixture.

6. The method of claim 5, wherein the silicon containing gas includes $SiCl_4$.

7. The method of claim 1, wherein the temperature for etching the first and the second polysilicon layer is controlled at the substantially the same as the temperature for etching the high-k material.

8. The method of claim 1, wherein protecting the sidewalls of the first polysilicon layer further comprises:
performing an oxygen flash process.

9. A method of etching a film stack for forming a gate structure, comprising:
providing a substrate having a film stack formed thereon in an etch chamber, wherein the film stack includes a hafnium oxide containing layer sandwiched between a first and a second polysilicon layers;
sequentially etching the first polysilicon layer, the hafnium oxide containing layer and the second polysilicon layer in the etch chamber while maintaining the substrate at a temperature between about 100 degrees Celsius and about 250 degrees Celsius in the same etch chamber, wherein no bias power is applied when etching the hafnium oxide containing layer; and
maintaining an interior surface of the etch chamber at a temperature in excess of about 100 degrees Celsius while etching the high-k material layer in the presence of the plasma.

10. The method of claim 9, wherein sequentially etching the first polysilicon layer, the hafnium oxide containing layer and the second polysilicon layer further comprises:

supplying a silicon containing gas to form a protective layer on a sidewall of the etched first polysilicon layer prior to etching the hafnium oxide containing layer.

11. The method of claim 10, wherein the silicon containing gas includes $SiCl_4$.

12. The method of claim 9, wherein sequentially etching the first polysilicon layer, the hafnium oxide containing layer and the second polysilicon layer further comprises:

supplying a halogen containing gas to etch the hafnium oxide containing layer.

13. The method of claim 12, wherein the halogen containing gas includes at least one of $BCl_3$ and $Cl_2$.

* * * * *

UNITED STATES PATENT AND TRADEMARK OFFICE
CERTIFICATE OF CORRECTION

PATENT NO. : 8,501,626 B2
APPLICATION NO. : 12/146303
DATED : August 6, 2013
INVENTOR(S) : Liu et al.

It is certified that error appears in the above-identified patent and that said Letters Patent is hereby corrected as shown below:

In the Specification:

Column 9, Line 63, please delete "150 decrees" and insert -- 150 degrees -- therefor;

Column 9, Line 63, please delete "120 decrees" and insert -- 120 degrees -- therefor.

Signed and Sealed this
Fifteenth Day of October, 2013

Teresa Stanek Rea
*Deputy Director of the United States Patent and Trademark Office*